(12) United States Patent  
Hein et al.

(10) Patent No.: US 11,575,809 B2  
(45) Date of Patent: Feb. 7, 2023

(54) HEATING DEVICE, CAMERA SYSTEM, EXTERNAL REAR VIEW DEVICE, MOTOR VEHICLES AND HEATING DEVICE

(71) Applicant: MOTHERSON INNOVATIONS COMPANY LIMITED, London (GB)

(72) Inventors: Peter Hein, Stuttgart (DE); Gueney Karadag, Stuttgart (DE)

(73) Assignee: Motherson Innovations Company Limited, London (GB)

(*) Notice: Subject to any disclaimer, the term of this patent is extended or adjusted under 35 U.S.C. 154(b) by 8 days.

(21) Appl. No.: 17/216,059

(22) Filed: Mar. 29, 2021

(65) Prior Publication Data

US 2021/0302807 A1  Sep. 30, 2021

(30) Foreign Application Priority Data

Mar. 31, 2020  (DE) .................... 10 2020 108 948.1

(51) Int. Cl.
*H04N 5/225* (2006.01)
*B60R 11/04* (2006.01)
(Continued)

(52) U.S. Cl.
CPC ......... *H04N 5/22521* (2018.08); *B60R 11/04* (2013.01); *B60S 1/02* (2013.01); *G02B 7/028* (2013.01); *G02B 27/0006* (2013.01); *G03B 17/55* (2013.01); *G03B 30/00* (2021.01); *H04N 5/2252* (2013.01); *H04N 5/2254* (2013.01);
(Continued)

(58) Field of Classification Search
CPC .... H04N 5/225; H04N 5/2251; H04N 5/2252; H04N 5/22521; H04N 5/2253; H04N 5/2254; H04N 5/2257; B60R 11/04; B60R 2300/00; B60S 1/02; B60S 1/023; B60S 1/026; G02B 7/028; G02B 27/0006; G03B 17/55; G03B 2217/002; G03B 30/00; H05K 7/20; H05K 7/2039
See application file for complete search history.

(56) References Cited

U.S. PATENT DOCUMENTS

2016/0103316 A1* 4/2016 Rousseau ................. B60R 1/00  
359/509  
2017/0099700 A1* 4/2017 Chae .................... H04N 5/2257  
(Continued)

FOREIGN PATENT DOCUMENTS

DE  102017201460 A1  3/2018  
EP      2510774 A1  10/2012  
(Continued)

OTHER PUBLICATIONS

German Office Action dated Feb. 24, 2021 of application No. DE 10 2020 108 948.1 X.

*Primary Examiner* — Twyler L Haskins  
*Assistant Examiner* — Akshay Trehan  
(74) *Attorney, Agent, or Firm* — Jones Day (57) ABSTRACT

A heating device for a lens barrel of an automotive camera assembly includes a heating element adapted to apply heat along the circumference of the lens barrel, and a tension socket and/or a tension ring adapted to press a ring-shaped part of the heating element against the lens barrel circumference. A camera system, an external rear view device, and a motor vehicle, each with at least one such heating device are also described.

16 Claims, 6 Drawing Sheets

(51) Int. Cl.
  *G03B 17/55*  (2021.01)
  *G02B 7/02*   (2021.01)
  *G02B 27/00*  (2006.01)
  *B60S 1/02*   (2006.01)
  *G03B 30/00*  (2021.01)
  *H05K 7/20*   (2006.01)

(52) U.S. Cl.
  CPC ......... *H04N 5/2257* (2013.01); *H05K 7/2039* (2013.01); *H05K 7/20* (2013.01)

(56) References Cited

U.S. PATENT DOCUMENTS

| | | | | |
|---|---|---|---|---|
| 2018/0017785 A1* | 1/2018 | Bulgajewski | ...... | G02B 27/0006 |
| 2018/0084161 A1* | 3/2018 | Lee | .......................... | B60R 11/04 |
| 2018/0345911 A1* | 12/2018 | Zurowski | ............... | G03B 17/55 |
| 2019/0208577 A1* | 7/2019 | Chien | .................... | G03B 17/55 |

FOREIGN PATENT DOCUMENTS

| | | |
|---|---|---|
| EP | 3006278 | 8/2018 |
| EP | 3410199 A1 | 12/2018 |

\* cited by examiner

FIG. 6 though few are common, these are exemplified in the prior art.

HEATING DEVICE, CAMERA SYSTEM, EXTERNAL REAR VIEW DEVICE, MOTOR VEHICLES AND HEATING DEVICE

CROSS-REFERENCE TO RELATED APPLICATIONS

This application claims the benefit of foreign priority to German Patent Application No. DE 10 2020 108 948.1, filed Mar. 31, 2020, which is hereby incorporated by reference herein in its entirety for all purposes.

BACKGROUND

1. Field of the Invention

The present disclosure relates to a heating device, a camera system, an external rear view device, a motor vehicle and a heating method.

2. Related Art

A motor vehicle can be equipped with a camera monitor system (CMS) comprising two cameras per side or wing, i.e. a wide angle camera and a farsighted camera. A heating device for the farsighted camera is described e.g. in PCT/EP2019/077092.

In particular the present disclosure relates to a heating device adapted for use with the wide angle camera and suited for heating a lens barrel of an automotive camera assembly. For that purpose, the heating device comprises a heating element adapted to apply heat along the circumference of the lens barrel.

The heat conduction from a conventional heating element to a lens barrel is subject to large losses due to heat conduction in the opposite direction. Also usage of a simple heating foil is often subject to damages, in particular due to peeling off and the like.

US 2019/0113743 A1 discloses a camera for a vehicular vision system which includes a housing and a lens barrel including a lens. The camera is configured to be disposed at an exterior portion of a vehicle so as to have a field of view exterior of the vehicle. The heating device is disposed at an exterior of the lens barrel. The heating device includes a thin foil heating element that at least partially circumscribes the lens barrel. The heating device includes an electrical lead that is configured to electrically connect to an electrical connector of the vehicle when the camera is disposed at the exterior portion of the vehicle.

Further, the disclosure relates to a method for controlling a heating device in particular for a lens barrel of a camera of an automotive camera assembly, but also for a cover glass of a camera of an automotive camera assembly.

In case of icing, a melting enthalpy (melting heat) must be introduced to reach temperatures above 0° C. In order to overcome this "thermal hurdle", a considerably higher power must be introduced at ambient temperatures below 0° C. at the start of heating than at temperatures above 0° C. But in case the heating power that is applied at the beginning is applied over a too long period of time, too high temperatures will occur, which may cause damage.

US 2019/0113743 A1 describes a temperature sensor for sensing a temperature at said camera, wherein, responsive to an output of said temperature sensor that is indicative of the temperature at said camera being below a threshold level, a control operates said heating device to increase the temperature of said lens barrel of said camera. In addition, responsive to a determination of current drawn by said heating device, a control estimates a temperature at said camera, and said control controls operation of said heating device based at least in part on the estimated temperature. Still further, said heating device is responsive to determination that a power consumption of said heating device reaches a threshold level.

SUMMARY

The present disclosure provides a heating device for a lens barrel of an automotive camera assembly, comprising a heating element adapted to apply heat along the circumference of the lens barrel, characterized by a tension socket and/or a tension ring adapted to press a ring-shaped part of the heating element against the lens barrel circumference.

According to one embodiment the heating device further comprises a heat transfer ring, preferably comprising aluminum, and/or a heat transfer paste between the ring-shaped part of the heating element and the lens barrel, and/or a heat transfer paste between the first ring-shaped part of the heating element and the socket and/or the torsion ring.

It is proposed that the socket comprises a recess through which a second part of the heating element can pass from the ring-shaped, first part of the heating element to a connector, with preferably the recess being selectable from a plurality of recesses, the second part being bar shaped, and/or the connector being adapted to be connected an electronic control unit.

Embodiments of the invention are further characterized in that the socket comprises connecting means for attaching the socket to a camera housing, in particular via a push and/or snap connection, with preferably the connecting means comprising at least one opening adapted to receive at least one projection or rib of the housing and/or being adapted to interlock with the camera housing.

It is also proposed that the socket comprises a rim embracing at least the first ring-shaped part and the lens barrel, and/or an inner ring extending from the inner surface of the socket and/or a shoulder, in particular provided by a S shaped cross-section at the end of the socket facing away from the housing, to snap fit around at least the first ring-shaped part and the lens barrel, preferably with the heat transfer ring, the heat transfer paste and/or the tension ring interposed between the first ring-shaped part and the lens barrel.

Still further embodiments can be characterized in that the socket comprises an elastomer material, preferably is made of rubber, in particular formed as a rubber cap, and/or has an inner diameter smaller than the outer diameter of the lens barrel carrying at least the first ring-shaped part of the heating element, and/or covers the lens barrel in a form-fit manner with a given preload.

In addition, it is proposed that the tension ring is provided with a slit, preferably between two end pieces having a complementary geometry and/or forming together a projection or rib, and/or made of metal.

It can also be proposed that the socket is mounted on the tension ring, with preferably the two end pieces engaging a further recess of the socket.

Embodiments of the invention can be characterized in that the heating element is L-shaped in side view, with a first leg being provided by the first part and the second leg being provided by the second part, and/or the second part of the heating element is adapted for connection with a plug and/or the electronic control unit, in particular via at least the connector and/or a cable, and/or the heating element comprises a heating foil, at least in its first, ring-shaped part.

A heating device of the present disclosure can further comprise at least one temperature sensor connected to a controller and/or the electronic control unit, in particular via a cable and/or a plug, for controlling the heating of the heating element.

It is proposed that the temperature sensor is arranged within the tension socket and/or the tension ring.

It is also proposed that the level of power applied to the heating element and/or the time of applying power to the heating element and/or the heating curve is controlled depending on the ambient temperature and/or the temperature measured by the temperature sensor, wherein preferably in case said temperature is below +3, 0 or −5 degree Celsius, a higher power level is applied in a first period of time, preferably between 60 to 200 seconds, than in a second period of time, and wherein preferably in case said temperature is at least −5, 0 or +3 degree Celsius, there is only one power level applied.

In summary, the present disclosure overcomes drawbacks like a loss of heating device energy by radiation wind chill and mechanical contact to cover and housing elements as well as a detachment of a heating element caused by peeling off in some places, with the respective lost contact leading to heat dissipation problems hot spots within the heating element and even a destruction of the heating element. That is, all these drawbacks can be overcome by making usage of a tension socket e.g. in form of a rubber cap and/or a tension ring e.g. in form of a metal ring that surround(s) the heating element, in particular in form of a heater foil, which is mounted on lens barrel circumference.

The rubber cap can cover the lens barrel in a form-fit manner with a given preload such that a uniform service pressure to the normal of the lens barrel exists. Preferably the cap has at least one recess through which the heating element can be fed to a connector and two recesses on the side which are fitted into grooves or ribs on a camera housing.

The metal tension ring that surrounds the heating element on the lens barrel applies a uniform tension to it. An additional advantage is that more power can be applied to the heating element because the tension ring also conducts heat aa it is formed from a metal, in particular aluminum.

According to another aspect of the disclosure, a camera system for a motor vehicle with the heating device of the disclosure is provided.

Still further, an external rear view device with such a camera system is provided wherein the heating element is adapted to be connected to the electronic control unit of the rear view device and/or the vehicle equipped with the rear view device, in particular via a bus system, like the CAN bus system.

In addition, according to a further aspect a motor vehicle with at least one heating device of the present disclosure, at least one camera system according to the present disclosure and/or at least one external rear view device according to the present disclosure is provided.

Such a motor vehicle can be characterized in that the heating element is controlled depending from at least one characteristic parameter of the vehicle, in particular the heating element being activated only during a driving mode of the vehicle.

According to a further aspect, the present disclosure provides a method for controlling a heating device for a cover glass or lens barrel of an automotive camera assembly, in particular according to the present disclosure, characterized in that there are 2 power levels for temperatures below at least one threshold temperature, preferably below +3, 0 or −5 degrees Celsius, and otherwise there is only 1 power level, wherein, in case of 2 power levels, the first level is adapted to melt ice and the second level is adapted to avoid icing and/or evaporate water droplets, and in case of only 1 power level, the same is adapted to avoid icing and/or evaporate water droplets.

The method of the present disclosure can comprise a first step of determining whether the motor vehicle is in a driving mode and applying power to the heating element only in case the motor vehicle is in a driving mode, with preferably the driving mode being given when the vehicle is driving in a forward or rearward direction.

Such a method can further comprise a second step of determining the temperature, in particular the ambient temperature, especially only in case the vehicle is in the driving mode, wherein preferably a temperature measured with a temperature sensor is compared to the at least one threshold temperature for determining the power level or power levels to be applied to the heating element and/or the time of applying the power to the heating element and/or a heating curve.

It is proposed that the power levels and/or the power jumps between 2 power levels depend on the heating device, in particular on whether a cover glass or a lens barrel is to be heated, and/or the point of time of the power jump between the 2 power levels depend on the heating device, in particular on whether a cover glass or a lens barrel is to be heated, or is fixed, with said point of time preferably being in a region from 60 sec. to 200 sec.

Still further, the method of the disclosure can comprise a third step of determining when the heating element has been active the last time, in particular after the second step, wherein preferably the determined time period since the last activation of the heating element is compared to at least one first threshold time period t(min) and in case the determined time period is shorter than the first threshold time period t(min), there is only 1 power level which is adapted to avoid icing and/or evaporate water droplets.

According to a further aspect the method can be characterized in that the first threshold time period t(min) depends on the determined temperature, wherein preferably t(min) =12 seconds/degree (40 degree+determined temperature).

The method of the disclosure can further comprise a fourth step of applying power to the heating element with 2 power levels, in case the ambient temperature is determined to be below 0 degrees, in particular below −5 degrees, and the time period since the last activation of the heating element is determined to be at least the first threshold time period, and/or a fifth step of applying power to the heating element with 1 power level, in case the ambient temperature is determined to be below 0 degrees, in particular below −5 degrees, and the time period since the last activation of the heating element is determined to be shorter the first threshold time period, and/or the sixth step of applying power to the heating element with 1 power level, in case the ambient temperature is determined to be at least 0 degrees or at least −5 degrees.

It is also proposed that the driving mode, the ambient temperature and/or the time are repeatedly determined, in particular for determining whether and when there is a point of time when to switch from the first power level to the second power level.

Thus, different heating curves were defined as a function of different ambient temperatures, in order to be able to generate the optimal amount of heat for both an ambient temperature at very low temperatures as well as at high temperatures. In fact, heating curves for temperatures below +3° or 0° C. reflect a two-stage heating strategy. In the first stage a heat is generated which aims to melt an icing (melting enthalpy). After a defined time t-switch this heating power is reduced to prevent icing or to evaporate droplets. The time t(switch) can for example be between 60 and 200 sec depending from the heating device.

The power jump between the two heating levels applied at ambient temperatures of <+3° C. prevents damages of the heating device, in particular the heating element. Heating levels at ambient temperatures of >=+3° C. have continuous power as there is substantially no danger of damaging the heating device.

The heating curves to be applied
to a cover glass heater for a lens of a farsighted camera as described e.g. in PCT/EP2019/077092 and
to the heating device applied to the lens of a wide angle camera differ only in the power output.

The L shaped heating element needs considerably more power for a satisfying result, due to a poorer thermal conductivity, as the heat is first directed into the entire body of the lens barrel until it heats up the camera cover surface. For cover glass heating less power is required as the energy is applied to a transparent electrically-conductive coating, preferably in form of an indium-tinoxide (ITO) layer, directly on the cover glass resulting in directly heating up the entire glass or rather lens surface.

BRIEF DESCRIPTION OF THE DRAWINGS

The foregoing summary, as well as the following detailed description, will be better understood when read in conjunction with the appended drawings. For the purpose of illustration, certain examples of the present description are shown in the drawings. It should be understood, however, that the invention is not limited to the precise arrangements and instrumentalities shown. The accompanying drawings, which are incorporated in and constitute a part of this specification, illustrate an implementation of system, apparatuses, and methods consistent with the present description and, together with the description, serve to explain advantages and principles consistent with the invention.

FIG. 2b is a side view of the heating element of FIG. 2a;

FIG. 3b is a front view of the camera system of FIG. 3a;

DETAILED DESCRIPTION

As can be seen from FIGS. 1a to 1d showing a camera system 1 of one embodiment of the present disclosure, a camera assembly 10 is at one end surrounded by a socket 20 and at the opposite end inserted in a housing 30. In detail, the camera assembly 10 comprises a camera 12 with a lens barrel 14 having a heat transfer ring 16 attached to its circumference. A heating element 18 is mounted on the heat transfer ring 16, and the socket 20 encompasses the lens barrel 14, the heat transfer ring 16 and a ring-shaped part 18a of the heating element 18 to ensure a maximal contact area of said parts for optimizing a heat transfer from the heating element 18 via the heat transfer ring 16 to the lens barrel 14.

Figure 2A:
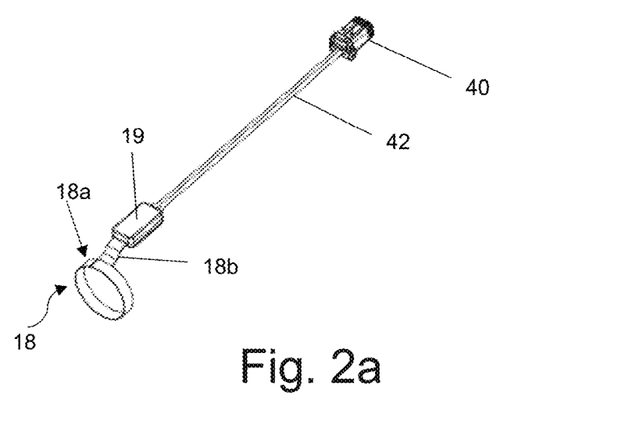
FIG. 2a is a perspective view of a heating element of an embodiment of the present disclosure to be used with the camera system shown in FIGS. 1a to 1d.
Figure 2B:
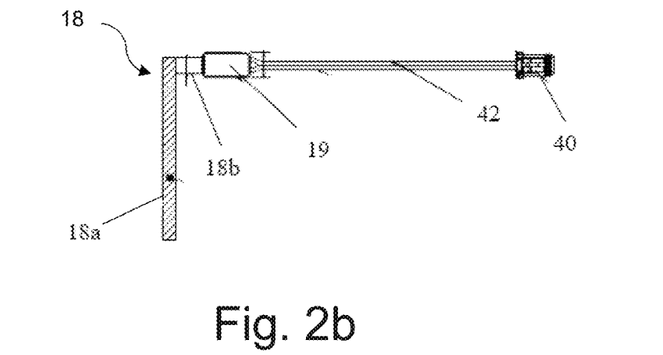

The heating element 18 comprises, in addition to the ring-shaped part 18a, a bar-shaped part 18b as can be best seen in FIGS. 2a and 2b. As the ring-shaped part 18a is arranged substantially perpendicularly to the bar-shaped part 18b, the heating element 18 takes a L-shape in the side view of FIG. 2b.

Figure 1A:
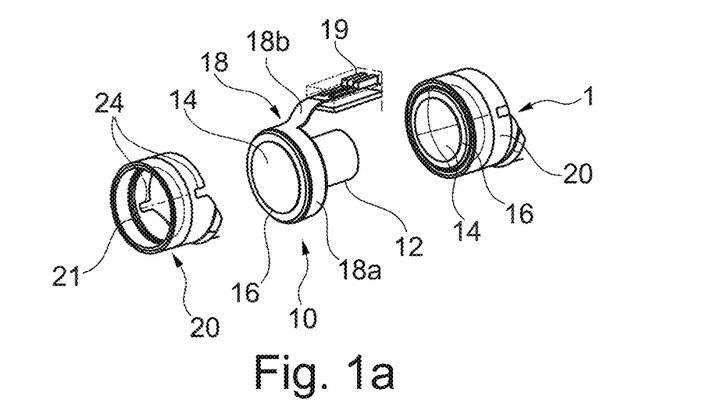
FIG. 1a provides both an exploded view of a camera system of one embodiment of the present disclosure and a perspective view of the assembled camera system.
Figure 1B:
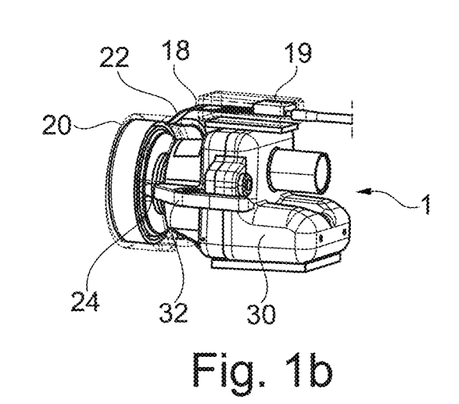
FIG. 1b is a side view of the assembled camera assembly of FIG. 1a, with a socket in phantom.
Figure 1C:
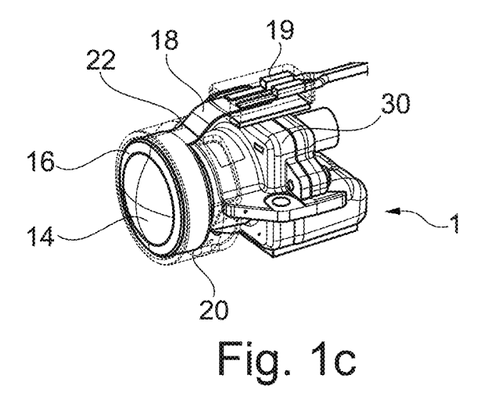
FIG. 1c is a perspective view of the camera assembly of FIG. 1b.
Figure 1D:
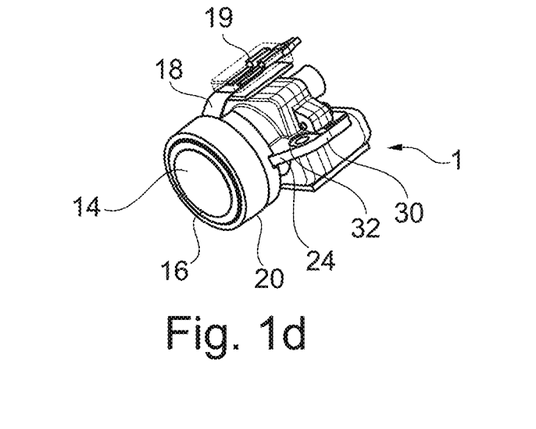
FIG. 1d is another perspective view of the camera assembly of FIG. 1b, with the socket not shown in phantom.

The heating element 18 can be connected to a connector 19 arranged outside the socket 20, see in particular FIG. 1d. For that purposes, the socket 20 is provided with a recess 22 allowing the bar-shaped part 18b of the heating element 18 to enter into the socket 20, see e.g. FIG. 1b. Via the connector 19 and a cable 42 the heating element 18 is attached to a plug 40, see FIGS. 2a and 2b, in order to be connectable in particular to an electronic control unit of a vehicle, not shown.

The socket 20 is also provided with an inner ring 21 projecting from its internal surface as shown in FIG. 1a to snap-fit around the housing 30 facing edge of the unit formed by the lens barrel 14, the heat transfer ring 16 and the ring-shaped part 18a of the heating element 18. Still further, the socket 20 is provided with openings 24 for engagement of ribs 32 provided by the housing 30, see FIGS. 1a and 1d.

Figure 2C:
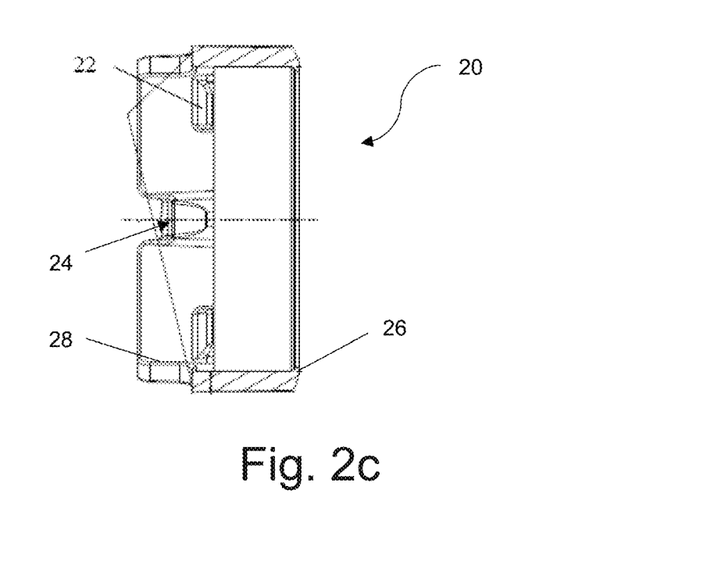
FIG. 2c is side view of an alternative socket of the camera system of FIGS. 1a to 1d.

An alternative socket 20 shown in FIG. 2c, includes 4 recesses 22 to select one for the insertion of the bar-shaped part 18b of the heating element 18, a rim 26 for further securing the arrangement of the heat transfer ring 16 as well as the ring-shaped part 18a of the heating element 18 on the lens barrel 14, and a shoulder 28 provided by a S shaped cross-section at its end facing away from the housing 30 to snap fit around the unit formed by the lens barrel 14, the heat transfer ring 16 and the ring-shaped part 18a of the heating element 18.

Figure 3A:
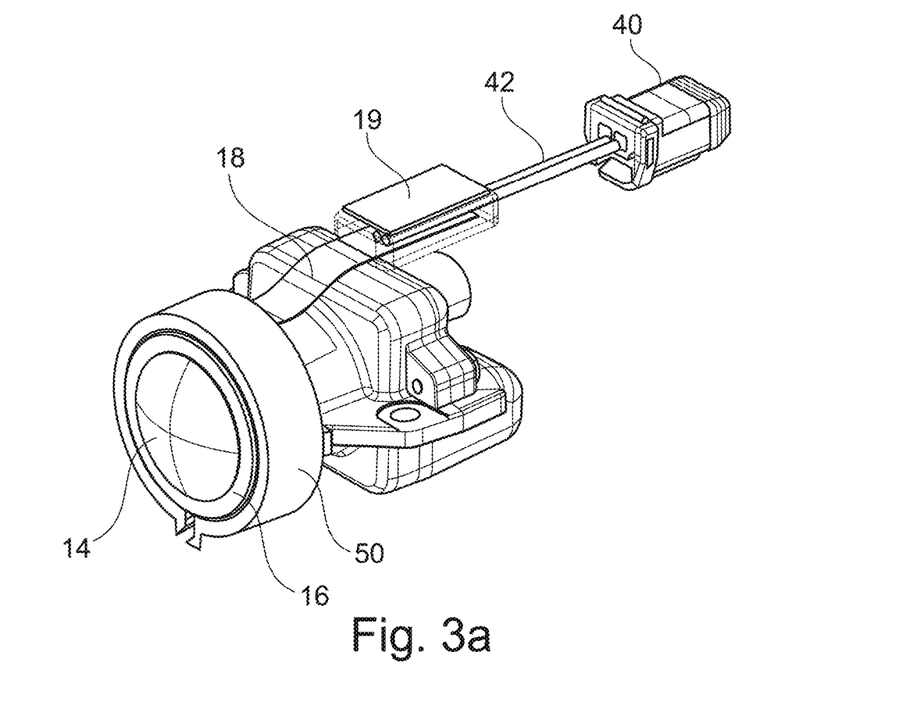
FIG. 3a is a perspective view of a camera system according to an alternative embodiment.
Figure 3B:
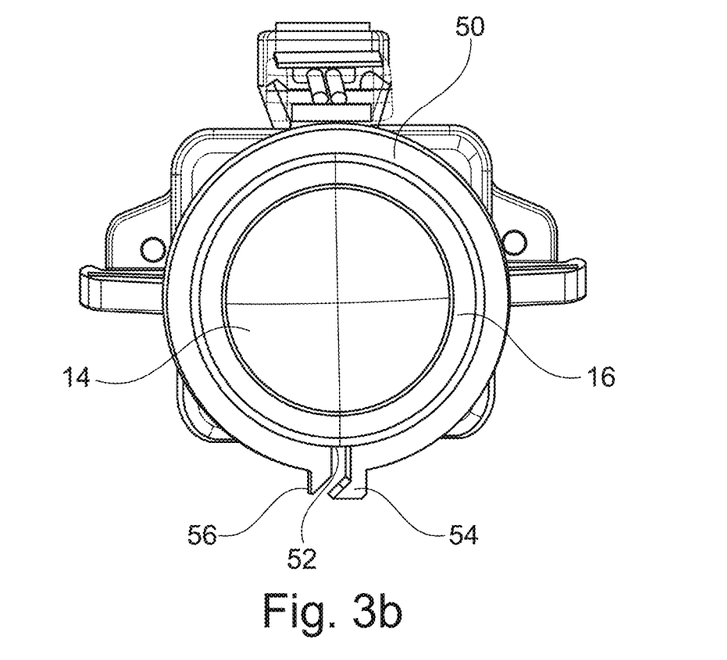

FIGS. 3a and 3b show a further camera system making usage of a tension ring 50 around the heat transfer ring 16, with the tension ring 50 being provided with a slit 52 to provide a C-shape facilitating the mounting thereof. In addition, the two end pieces 54 and 56 on both sides of the slit 52 are provided with a complimentary geometry in order to facilitate attachment to each other to secure the mounting of the tension ring 50 on the heat transfer ring 16.

The tension ring 50 can be made from metal, whereas the socket 20 preferably is provided in form of a rubber cap. Such a rubber cap can even be mounted around the metal tension ring.

Figure 4:
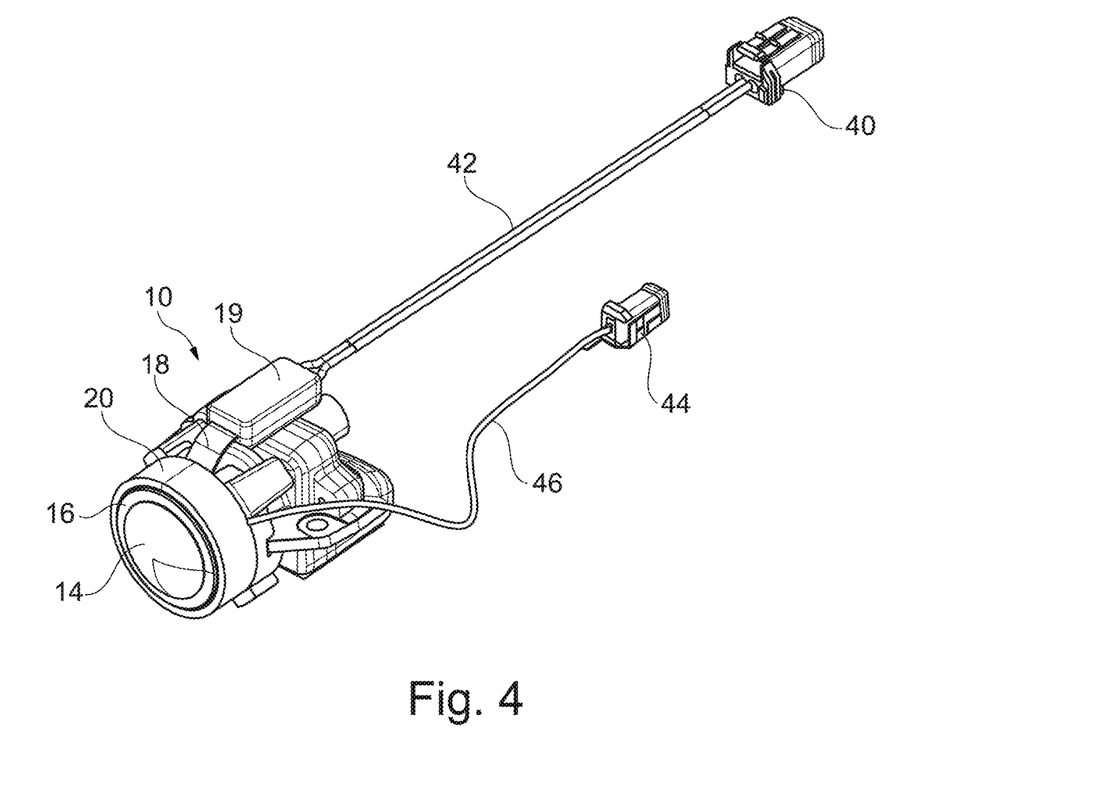
FIG. 4 is a perspective view of a camera system of a further embodiment.

The camera assembly 10 shown in FIG. 4 provides a further embodiment of this disclosure and illustrates the attachment of a temperature sensor within the socket 20 and being connected to a plug 44 via a cable 46. The temperature sensor is of particular importance with respect to realizing a heating method.

Figure 5:
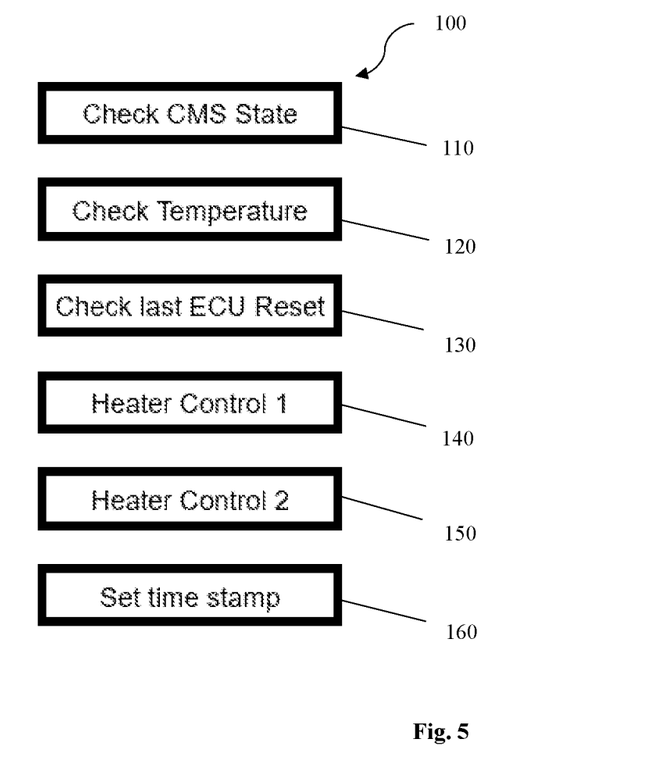
FIG. 5 is a flowchart of a heating method according to an embodiment.

FIG. 5 depicts a heating method 100 according to an embodiment, with heating curves for outside temperatures far below 0° C. using a two-stage heating strategy. In the first stage a heat is generated which aims to melt an icing (melting enthalpy), and in a second stage, which starts after a defined time t(switch), the heating power is reduced to prevent icing or to evaporate droplets.

The method can have steps as follows:

The first step 110 is to check whether the vehicle status is correct. That is, it is checked whether the vehicle is in a driving mode during which a defrost function can only be active. A driving mode can be in form of a forward driving mode or reverse driving mode. The vehicle status is cyclically monitored.

If the vehicle is in a valid condition, i.e. in a driving mode, the second step 120 is to determine the ambient or rather outside temperature. Depending on the determined temperature, a heating curve index is set to determine the appropriate heating curve, with one or two stages.

Figure 6:
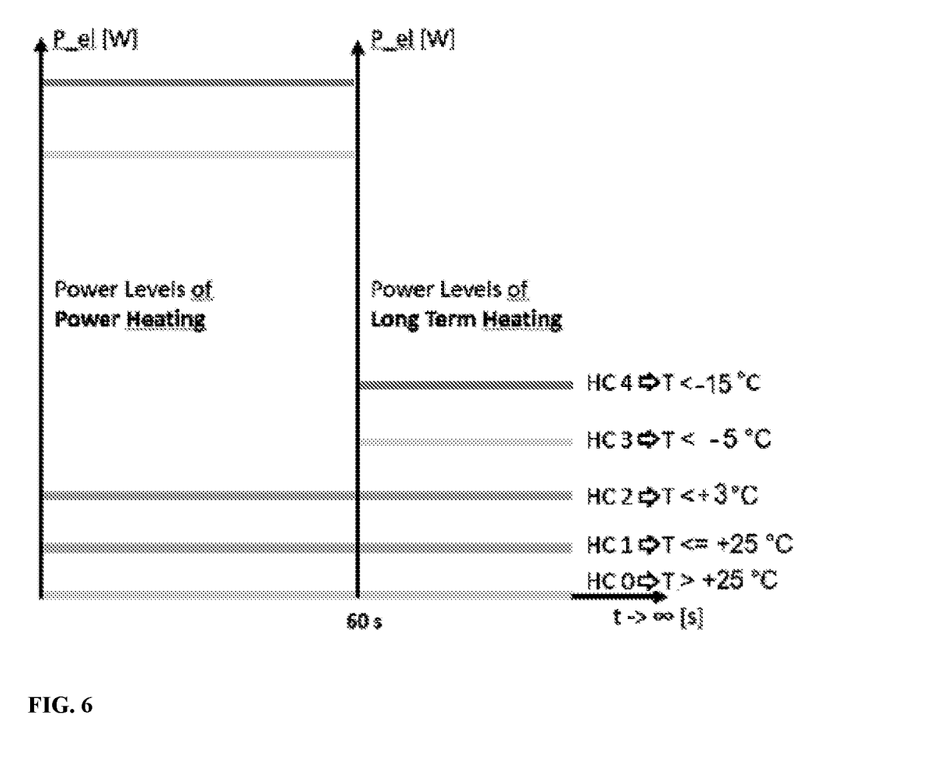
FIG. 6 shows heating curves for five outside temperature ranges.

For example there can be 5 heating curves defined by 5 heating curve indices as shown in FIG. 6, with the following heating curve indices:

HC0 for temperatures above 25° C.,
HC1 for temperatures from 25° C. to 3° C.,
HC2 for temperatures below 3° to −5° C.,
HC3 for temperatures below −5° to 15° C. and
HC4 for temperatures below −15° C.; with only the heating curve index HC3 and HC4 resulting in a 2 level heating. The power levels of the heating curves defined by the heating curve indices can also differ from each other.

The power jump can take place after 60 sec.

Thus, every power level has to be applied for a specific temperature range. The first set of power levels is melting ice in case of an icing on the surface of the cover glass or lens and are called "Power Heating". The second set of power levels are for avoiding an icing or fogging on the surface of the cover glass or lens and are called "Long Term Heating".

The power levels also depend on whether a cover glass as described in PCT/EP2019/077092 or a lens barrel as described above is to be heated. The respective data can be provided via CAN (Controlled Area Network) from the vehicle to the heating device.

When the heating curve index has been determined, the third step 130 is to check when the vehicle has last left the status in which a heating was allowed, and the respective time span is compared with a calculated time in order to avoid that a short interruption of a journey, such as for refueling or a short shopping trip, leads to a new heating cycle with high heat input. Said calculated time t(min) depends on the outside temperature T(outside) and represents a minimum holding time: t(min)=12 sec/° C. [40° C.+T(outside)].

If t(min) is longer than the measured holding time, the heating cycle cannot be carried out with a high heat input from the start. As a result of this "Check last ECU Reset" the answer "NO" is set.

If t(min) is less than the measured holding time, the heating cycle can start from the beginning. As a result of "Check last ECU Reset" the answer "YES" is set.

In the fourth step 140 "Heater Control 1", the time for the second stage is checked.

If the active heating time is less than t(switch), heating can be carried out with a higher power. As a result of this "Heater Control 1" the answer "YES" is set.

When t(switch) has expired in the current heating cycle, the second stage is to be used to heat with a lower power. As a result of this "Heater Control 1" the answer "NO" is set.

In the fifth step 150 "Heater Control 2", it is checked whether the results of "Check last ECU Reset" and "Heater Control 1" both have received the answer "YES". If this is the case, the heating cycle can be started from the beginning.

In the sixth step "Set time stamp", t(switch) is set to 0.

It will be appreciated by those skilled in the art that changes could be made to the embodiments described above without departing from the broad inventive concept thereof. It is understood, therefore, that the invention disclosed herein is not limited to the particular embodiments disclosed, and is intended to cover modifications within the spirit and scope thereof.

REFERENCE SIGNS 1 camera system
10 camera assembly
12 camera
14 lens barrel
16 heat transfer ring
18 heating element
18a ring-shaped part
18b bar-shaped part
19 connector
20 socket
21 inner ring
22 recess
24 opening
26 rim
28 shoulder
30 housing
32 rib
40 plug
42 cable
44 plug
46 cable
50 tension ring
52 slit
54 end piece
56 end piece
100 heating method
110-160 method steps

What is claimed is:

1. A heating device for a lens barrel of an automotive camera assembly, comprising
    a heating element adapted to apply heat along the circumference of the lens barrel, wherein the heating element is L-shaped in a side view, with a first leg being provided by a ring-shaped first part, and a second leg being provided by a second part, wherein the ring-shaped first part establishes an open cylinder, wherein a lens is arranged inside the open cylinder of the ring-shaped first part; and
    a tension socket, which is adapted to press the ring-shaped first part of the heating element against the lens barrel circumference and comprises a recess through which a second part of the heating element can pass from the ring-shaped first part of the heating element to a connector.

2. The heating device of claim 1, further comprising at least one of:
    a heat transfer ring comprising aluminum;
    a heat transfer paste between the ring-shaped first part of the heating element and the lens barrel; or
    a heat transfer paste between the first ring-shaped part of the heating element and the tension socket and/or a tension ring.

3. The heating device of claim 1, wherein at least one of:
the recess is selectable from a plurality of recesses,
the second part is bar shaped, or
the connector is adapted to be connected to an electronic control unit.

4. The heating device of claim 1, wherein
the socket comprises connecting means for attaching the socket to a camera housing via a push and/or snap connection, and
the connecting means at least one of:
comprising at least one opening adapted to receive at least one projection or rib of the housing, or
being adapted to interlock with the camera housing.

5. The heating device of claim 1, wherein the socket comprises at least one of:
a rim embracing at least the first ring-shaped part and the lens barrel, or
an inner ring extending from the inner surface of the socket and/or a shoulder provided by a S shaped cross-section at the end of the socket facing away from the housing, to snap fit around at least the ring-shaped first part and the lens barrel, with the heat transfer ring, the heat transfer paste and/or a tension ring interposed between the first ring-shaped part and the lens barrel.

6. The heating device of claim 1, wherein the socket at least one of:
comprises an elastomer material made of rubber and formed as a rubber cap,
has an inner diameter smaller than the outer diameter of the lens barrel carrying at least the ring-shaped first part of the heating element, or
covers the lens barrel in a form-fit manner with a given preload.

7. The heating device of claim 1, further comprising:
a tension ring adapted to press a ring-shaped first part of the heating element against the lens barrel circumference, with the socket being mounted on the tension ring,
wherein preferably the tension ring is at least one of provided with a slit or made of metal.

8. The heating device of claim 7, wherein the slit is provided between two end pieces having a complementary geometry and/or forming together a projection or rib, and the two end pieces of the tension ring engage a further recess of the socket.

9. The heating device of claim 1, wherein at least one of:
the second part of the heating element is at least one of adapted for connection with a plug or the electronic control unit, via at least the connector and/or a cable, or
the heating element comprises a heating foil, at least in its first, ring-shaped first part.

10. The heating device of claim 1, further comprising at least one temperature sensor connected to a controller and/or the electronic control unit via a cable and/or a plug for controlling the heating of the heating element.

11. The heating device of claim 10, wherein the temperature sensor is arranged within the tension socket and/or a tension ring.

12. The heating device of claim 1, wherein the level of power applied to the heating element and/or the time of applying power to the heating element and/or a heating curve is controlled by an electronic control unit depending on an ambient temperature and/or a temperature measured by the temperature sensor, the ambient temperature or the temperature measured by the temperature sensor provided to the heating device by a CAN bus system,
wherein, in case the temperature is below −5 degree Celsius, a higher power level is applied to the heating element in a first period of time, between 60 and 200 seconds, than in a second period of time, and
wherein, in case the temperature is equal to or above +3 degree Celsius, there is only one power level applied to the heating element.

13. A camera system for a motor vehicle comprising:
a heating device for a lens barrel of an automotive camera assembly, the heating device comprising:
a heating element adapted to apply heat along the circumference of the lens barrel, wherein the heating element is L-shaped in a side view, with a first leg being provided by a ring-shaped first part, and a second leg being provided by a second part, wherein the ring-shaped first part establishes an open cylinder, wherein a lens is arranged inside the open cylinder of the ring-shaped first part; and
a tension socket, which is adapted to press the ring-shaped first part of the heating element against the lens barrel circumference and comprises a recess through which a second part of the heating element can pass from the ring-shaped first part of the heating element to a connector.

14. An external rear view device comprising a camera system for a motor vehicle comprising:
a heating device for a lens barrel of an automotive camera assembly, the heating device comprising:
a heating element adapted to apply heat along the circumference of the lens barrel wherein the heating element is L-shaped in a side view, with a first leg being provided by a ring-shaped first part, and a second leg being provided by a second part, wherein the ring-shaped first part establishes an open cylinder, wherein a lens is arranged inside the open cylinder of the ring-shaped first part; and
a tension socket, which is adapted to press the ring-shaped first part of the heating element against the lens barrel circumference and comprises a recess through which a second part of the heating element can pass from the ring-shaped first part of the heating element to a connector,
wherein the heating element is adapted to be connected to the electronic control unit of the rear view device and/or the vehicle equipped with the rear view device via a bus system including a CAN bus system.

15. A motor vehicle, comprising at least one of:
a heating device for a lens barrel of an automotive camera assembly, the heating device comprising:
a heating element adapted to apply heat along the circumference of the lens barrel wherein the heating element is L-shaped in a side view, with a first leg being provided by a ring-shaped first part, and a second leg being provided by a second part, wherein the ring-shaped first part establishes an open cylinder, wherein a lens is arranged inside the open cylinder of the ring-shaped first part; and
a tension socket, which is adapted to press the ring-shaped first part of the heating element against the lens barrel circumference and comprises a recess through which a second part of the heating element can pass from the ring-shaped first part of the heating element to a connector,
a camera system comprising the heating device; or
an external rearview device comprising the camera system.

16. The motor vehicle according to claim 15, wherein the heating element is controlled depending from at least one characteristic parameter of the vehicle, the heating element being activated only during a driving mode of the vehicle.

* * * * *